United States Patent
Kim

(10) Patent No.: US 9,759,944 B2
(45) Date of Patent: Sep. 12, 2017

(54) SIDE COVER FILM FOR DISPLAY AND DISPLAY DEVICE COMPRISING THE SAME

(71) Applicant: LG DISPLAY CO., LTD., Seoul (KR)

(72) Inventor: TaeJin Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/253,200

(22) Filed: Aug. 31, 2016

(65) Prior Publication Data
US 2017/0059926 A1 Mar. 2, 2017

(30) Foreign Application Priority Data
Aug. 31, 2015 (KR) .................. 10-2015-0123093

(51) Int. Cl.
- *G02F 1/1333* (2006.01)
- *G02F 1/1335* (2006.01)
- *H01L 27/32* (2006.01)

(52) U.S. Cl.
CPC .. *G02F 1/133512* (2013.01); *G02F 1/133308* (2013.01); *G02F 2202/22* (2013.01); *H01L 27/3272* (2013.01)

(58) Field of Classification Search
CPC ......... G02F 1/133512; G02F 1/133308; G02F 2202/22; H01L 27/3272
See application file for complete search history.

(56) References Cited

U.S. PATENT DOCUMENTS

| | | | |
|---|---|---|---|
| 2002/0191131 A1* | 12/2002 | Ota ................... | G02F 1/133512 349/110 |
| 2013/0250202 A1* | 9/2013 | Qi ..................... | G02F 1/133512 349/58 |
| 2014/0240606 A1* | 8/2014 | Tomomasa ........ | G02F 1/133308 348/725 |
| 2014/0272322 A1* | 9/2014 | Lee ................... | G02F 1/133512 428/192 |
| 2015/0325815 A1* | 11/2015 | Kang ................. | H01L 51/5293 257/88 |
| 2015/0349030 A1* | 12/2015 | Ono .................... | H01L 51/5284 257/40 |
| 2016/0223862 A1* | 8/2016 | Kang ................ | G02F 1/133524 |
| 2016/0291399 A1* | 10/2016 | Zhang ............... | G02F 1/133308 |

* cited by examiner

*Primary Examiner* — Donald Raleigh
(74) *Attorney, Agent, or Firm* — Birch, Stewart, Kolasch & Birch, LLP

(57) ABSTRACT

Discussed are a side cover film for a display device and the display device including the same, which include a reduced bezel area and which effectively discharge static electricity. The display device can include a display panel including a signal line, a panel supporting frame supporting the display panel, a driving circuit unit connected to the signal line at a side surface of the display panel and disposed on one side surface of the panel supporting frame, a cover shield covering the driving circuit unit, and a side cover film covering the side surface of the display panel.

11 Claims, 4 Drawing Sheets

SIDE COVER FILM FOR DISPLAY AND DISPLAY DEVICE COMPRISING THE SAME

CROSS-REFERENCE TO RELATED APPLICATIONS

This application claims the priority benefit of the Korean Patent Application No. 10-2015-0123093 filed on Aug. 31, 2015, which is hereby incorporated by reference as if fully set forth herein.

BACKGROUND

Field of the Invention

The present invention relates to a display device, and more particularly, to a display device including a side cover film for display, which reduces static electricity.

Discussion of the Related Art

To date, display devices such as liquid crystal display (LCD) devices, plasma display panels (PDPs), organic light emitting display (OLEDs) devices, and the like have been developed. The display devices each include a display panel for displaying an image and a driving circuit unit for driving the display panel.

FIG. 1 is a schematic diagram for describing a related art display device.

Referring to FIG. 1, the related art display device includes a display panel 10, a driving circuit unit 30, and a front case 50. The display panel 10 adjusts a transmittance of light incident from each of a plurality of light sources to display a certain image. To this end, the display panel 10 includes a lower substrate 13 and an upper substrate 15.

Various signal lines (not shown) are arranged on the lower substrate 13, and a signal pad 17 is provided in an end of each of the signal lines.

The upper substrate 15 is formed smaller in size than the lower substrate 13 and is opposite-bonded to a portion other than the signal pad 17 of the lower substrate 13 with a liquid crystal layer therebetween. A color filter corresponding to each of a plurality of pixels is formed on the upper substrate 15, and depending on a driving type of the liquid crystal layer, a common electrode receiving a common voltage may be additionally formed on the upper substrate 15.

The driving circuit unit 30 is connected to the signal pad 17 to drive the display panel 10. The driving circuit unit 30 includes a flexible circuit film 31, a driving integrated circuit (IC) 33, and a data printed circuit board (PCB) 35.

The flexible circuit film 31 is adhered to a top of the signal pad 17 which is exposed. The driving IC 33 is adhered to a top of the flexible circuit film 31. The driving IC 33 may have a chip-on film (COF) structure.

The data PCB 35 applies various signals to the display panel 10 through the flexible circuit film 31. To this end, the data PCB 35 is directly connected to the flexible circuit film 31.

The front case 50 covers a front edge of the display panel 10 and the driving circuit unit 30. In the related art display device, since the front case 50 for surrounding the exposed signal pad 17 and the driving circuit unit 30 is provided, a bezel area of the display device is enlarged.

Moreover, in the related art display device, in order to prevent static electricity from occurring when driving the display device, the lower substrate 13 should be electrically connected to the upper substrate 15 by a connection electrode, and the lower substrate 13 should be electrically connected to the front case 50. For this reason, the bezel area of the display device is enlarged, and a process of forming an electrostatic discharge (ESD) structure is complicated, causing a reduction in productivity.

The above-described background is possessed by the inventor of the application for deriving the invention, or is technology information that has been acquired in deriving the invention. The above-described background is not necessarily known technology disclosed to the general public before the application of the invention.

SUMMARY

Accordingly, the present invention is directed to provide a side cover film for display and a display device comprising the same that substantially obviate one or more problems due to limitations and disadvantages of the related art.

An aspect of the present invention is directed to provide a side cover film for display and a display device comprising the same, which include a reduced bezel area and effectively discharge static electricity.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a display device including a display panel including a signal line, a panel supporting frame supporting the display panel, a driving circuit unit connected to the signal line at a side surface of the display panel and disposed on one side surface of the panel supporting frame, a cover shield covering the driving circuit unit, and a side cover film covering the side surface of the display panel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EMBODIMENTS

Figure 1:
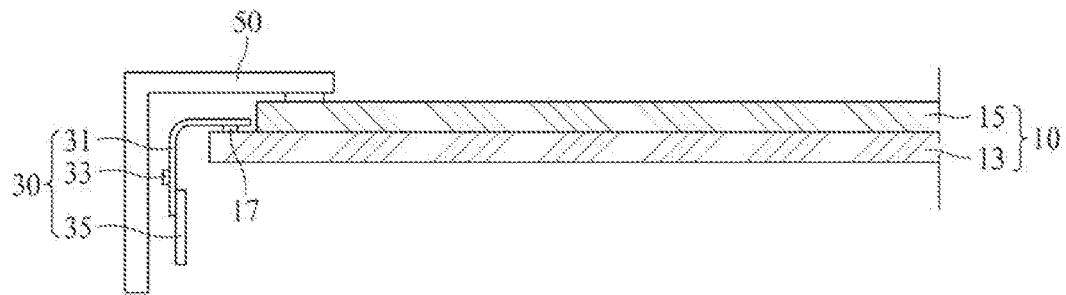
FIG. 1 is a cross-sectional view for describing a related art display device.

Reference will now be made in detail to the exemplary embodiments of the present invention, examples of which are illustrated in the accompanying drawings. Wherever possible, the same reference numbers will be used throughout the drawings to refer to the same or like parts.

The terms described in the specification should be understood as follows.

The terms described in the specification should be understood as follows. As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, exemplary embodiments of a side cover film for display and a display device comprising the same according to the present invention will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present invention, the detailed description will be omitted.

Figure 2:
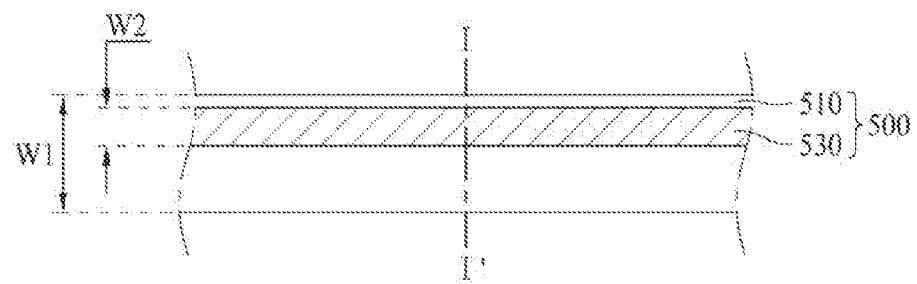
FIG. 2 is a plan view illustrating a side cover film for a display device according to an embodiment of the present invention.
Figure 3:
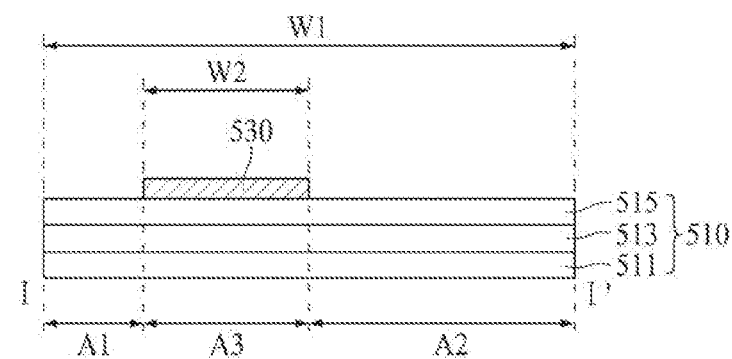
FIG. 3 is a cross-sectional view schematically illustrating a cross-sectional surface taken along line I-I' of FIG. 2.

FIG. 2 is a plan view illustrating a side cover film 500 for a display device according to an embodiment of the present invention. FIG. 3 is a cross-sectional view schematically illustrating a cross-sectional surface taken along line I-I' of FIG. 2.

Referring to FIGS. 2 and 3, the side cover film 500 for display according to an embodiment of the present invention may include a light blocking layer 510 and a conductive layer 530.

The light blocking layer 510 may have a first width W1 and may be adhered to a side surface of a display module to block light incident on the inside. The light blocking layer 510 may include a light shielding layer 511, a metal layer 513, and an adhesive layer 515.

If the side cover film 500 is adhered to the display module, the light shielding layer 511 prevents external light from being incident on the inside of the display module and prevents light leakage from occurring in a joint of the display module. To this end, the light shielding layer 511 may include a polyester (PET) film including a black pigment. However, the present embodiment is not limited thereto.

The metal layer 513 may be provided on the light shielding layer 511. The metal layer 513 may be formed of a metal material, which is good in conductivity, such as aluminum (Al), copper (Cu), and/or the like. In this case, black ink may be thinly coated on the metal layer 513.

The adhesive layer 515 may be provided on the metal layer 513. The adhesive layer 515 may be a portion that directly contacts the conductive layer 530 and the display module.

The light blocking layer 510 configured as described above may be divided into a first adhesive area A1, a second adhesive area A2, and a third adhesive area A3.

The first adhesive area A1 and the second adhesive area A2 may be disposed in parallel with the conductive layer 530 therebetween.

The third adhesive area A3 may be defined between the first adhesive area A1 and the second adhesive area A2 and may be adhered to the conductive layer 530.

The conductive layer 530 may be adhered to the adhesive layer 515 of the light blocking layer 510. The conductive layer 530 may be disposed in the third adhesive area A3.

The conductive layer 530 may have a second width W2 narrower than the first width W1 of the light blocking layer 510. That is, a width (e.g., the second width W2) of the conductive layer 530 may be less than a width (e.g., the first width W1) of the light blocking layer 510. The conductive layer 530 may be formed of, for example, a material having good conductivity like silver (Ag). However, the present embodiment is not limited thereto.

As described above, the side cover film 500 may be adhered to the side surface of the display module instead of a front case. Accordingly, in comparison with the related art display device, the bezel area is reduced.

Moreover, external light is prevented from being incident on the inside of the display module, thereby preventing light leakage from occurring in the joint of the display module.

Moreover, since the conductive layer acts as a path through which static electricity is discharged, the static electricity occurring in the display panel is effectively discharged.

Figure 4:
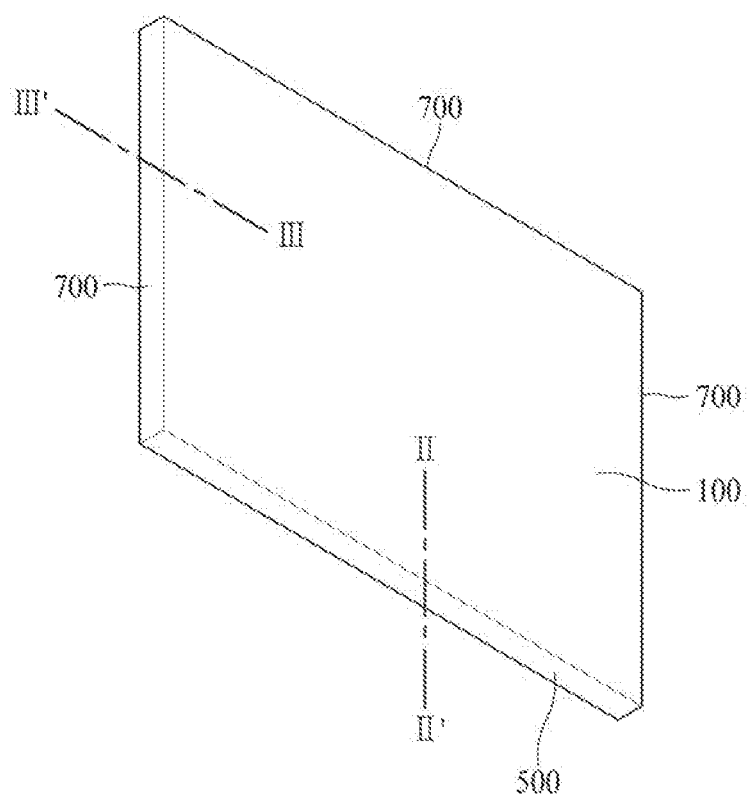
FIG. 4 is a diagram schematically illustrating a display device according to an embodiment of the present invention.
Figure 5:
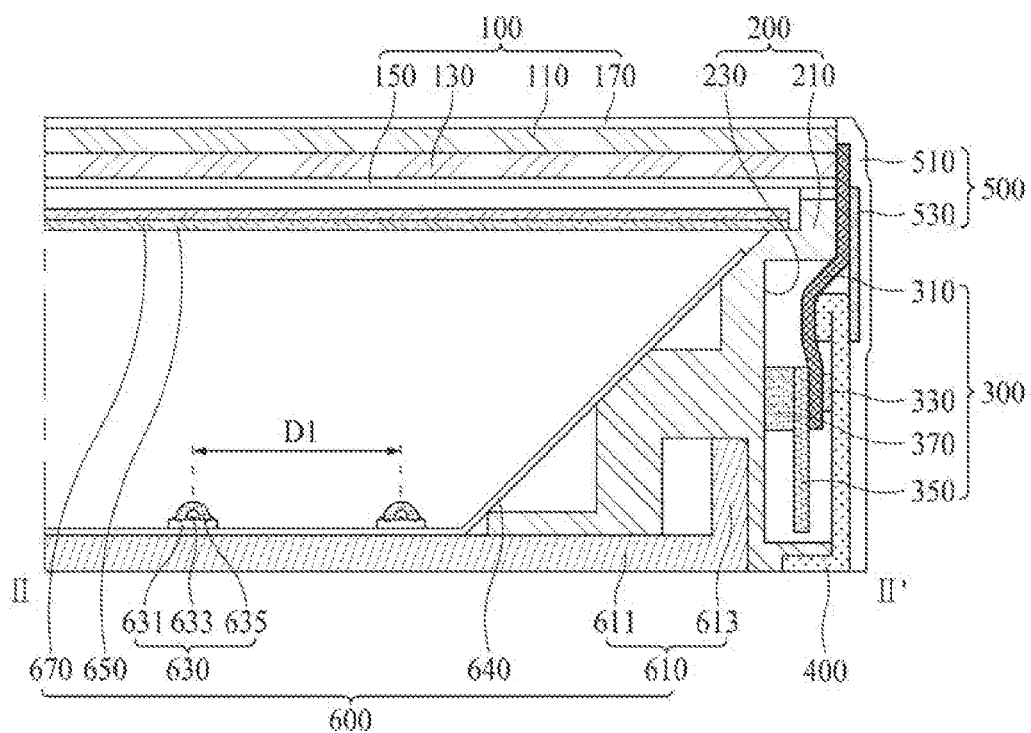
FIG. 5 is a cross-sectional view schematically illustrating a cross-sectional surface taken along line II-II' of FIG. 4.
Figure 6:
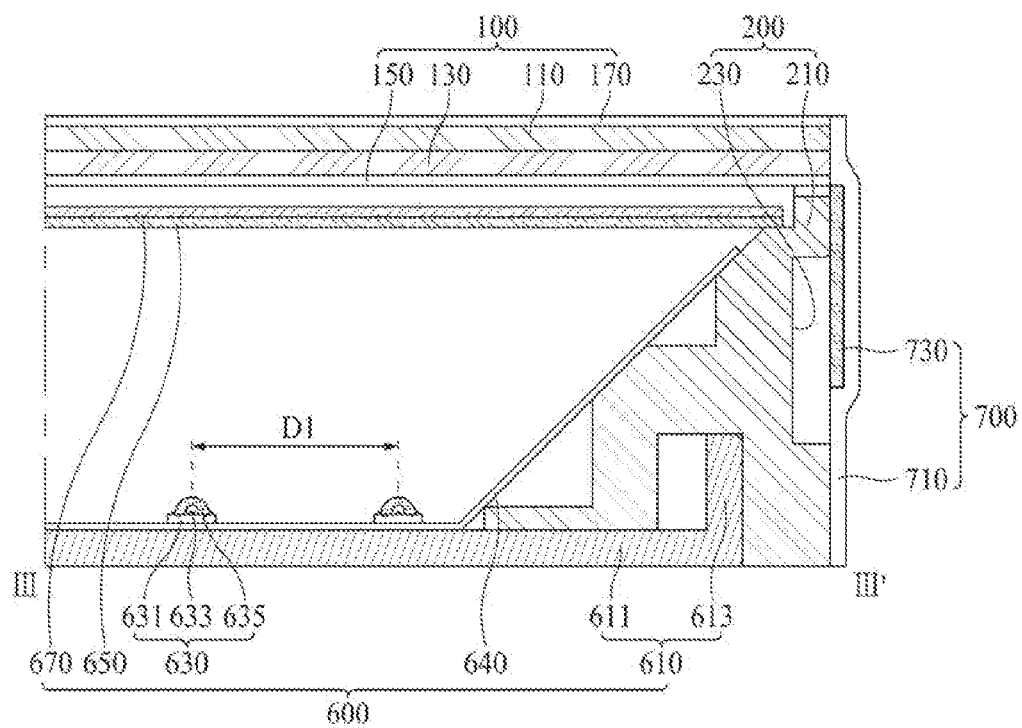
FIG. 6 is a cross-sectional view schematically illustrating a cross-sectional surface taken along line III-III' of FIG. 4.

FIG. 4 is a diagram schematically illustrating a display device according to an embodiment of the present invention. FIG. 5 is a cross-sectional view schematically illustrating a cross-sectional surface taken along line II-II' of FIG. 4. FIG. 6 is a cross-sectional view schematically illustrating a cross-sectional surface taken along line III-III' of FIG. 4. The drawings relate to a display device including the side cover film for the display (e.g., the side cover film of FIGS. 2 and/or 3). Hereinafter, only different elements may be described. Further, all the components of the display device according to all embodiments of the present invention are operatively coupled and configured.

Referring to FIGS. 4 to 6, the display device according to an embodiment of the present invention may include a display panel 100, a panel supporting frame 200, a driving circuit unit 300, a cover shield 400, a side cover film 500, and a backlight unit 600.

The display panel 100 may adjust a transmittance of light incident from each of a plurality of light sources to display a certain image. To this end, the display panel 100 may include a lower substrate 110, an upper substrate 130, a lower polarization film 150, and an upper polarization film 170.

A plurality of signal lines may be arranged on the lower substrate 110. The lower substrate 110 may include a plurality of pixels respectively provided in a plurality of areas defined by intersections of the plurality of signal lines, namely, a plurality of gate lines and a plurality of data lines. Each of the plurality of pixels may include a thin film transistor (TFT) connected to a corresponding gate line and a corresponding data line, a pixel electrode connected to the TFT, and a common electrode which is disposed adjacent to the pixel electrode and receives a common voltage. In the lower substrate 110, an electric field corresponding to a difference voltage between the common voltage and a data voltage applied to each pixel may be generated to adjust a light transmittance of a liquid crystal layer. The plurality of gate lines and the plurality of data lines arranged on the lower substrate 110 may each be referred to as a signal line.

The upper substrate 130 may be opposite-bonded to the lower substrate 110 with the liquid crystal layer therebetween. A color filter corresponding to each pixel may be formed on the upper substrate 130, and depending on a driving type of the liquid crystal layer, the common electrode receiving the common voltage may be additionally formed on the upper substrate 130.

According to an embodiment of the present invention, the flexible circuit film 310 may be adhered to a side surface of each of the lower substrate 110 and the upper substrate 130, and thus, a top of the signal line is not exposed to the outside unlike the related art. Accordingly, the lower substrate 110 and the upper substrate 130 may have the same size.

A detailed configuration of each of the lower substrate 110 and the upper substrate 130 may be implemented as various types well known to those skilled in the art depending on a driving mode of the liquid crystal layer, for example, a twisted nematic (TN) mode, a vertical alignment (VA) mode, an in-plane switching (IPS) mode, a fringe field switching (FFS) mode, etc.

The lower polarization film 150 may be adhered to a bottom of the lower substrate 110 to polarize light incident on the lower substrate 110. In this case, the lower polarization film 150 may be adhered to a whole bottom area of the lower substrate 110 or may be adhered to a portion other than a bottom edge of the lower substrate 110.

The upper polarization film 170 may be adhered to a front surface of the upper substrate 130 to polarize light which is output to the outside through the upper substrate 130.

The lower polarization film 150 and the upper polarization film 170 may have different functions through a drawing process which is performed in opposite directions, and may each have a shrinking force which is applied in opposite directions in the drawing process. The lower polarization film 150 and the upper polarization film 170 may be respectively adhered to the lower substrate 110 and the upper substrate 130, and thus, the shrinking forces of the lower polarization film 150 and the upper polarization film 170 may be offset, whereby the display panel 100 maintains a planar state without being bent in an up or down direction.

The panel supporting frame 200 may support a rear edge of the display panel 100 and may accommodate the driving circuit unit 300. The panel supporting frame 200 may include a side wall part 210 and an accommodating part 230.

The side wall part 210 may support the rear edge of the display panel 100. A panel coupling member 220 may be provided between the side wall part 210 and the display panel 100. The display panel 100 may be stably fixed to the side wall part 210 by the panel coupling member 220. The panel coupling member 220 may be a photocurable adhesive, a thermocurable adhesive, a double-sided tape, or a double-sided adhesive pad.

The accommodating part 230 may be provided on an outer surface of the side wall part 210. The accommodating part 230 may accommodate a lower portion of the driving circuit unit 300. Therefore, the accommodating part 230 may be concavely provided on an outer surface of the panel supporting frame 200.

The driving circuit unit 300 may be disposed on a side surface of the display panel 100 and may be connected to the signal line. In this case, an upper portion of the driving circuit unit 300 may be connected to the signal line, and a lower portion of the driving circuit unit 300 may be accommodated into the accommodating part 230. Also, the driving circuit unit 300 may be disposed on one side surface of the panel supporting frame 200 and may contact the cover shield 400.

The driving circuit unit 300 may include a flexible circuit film 310, a driving IC 330, and a PCB 350.

The flexible circuit film 310 may be adhered to the side surface of the display panel 100 and may be connected to the signal line. The flexible circuit film 310 may cover an area from the side surface of the display panel 100 to the outer surface of the side wall part 210 included in the panel supporting frame 200 and may be accommodated into the accommodating part 230. In this case, the flexible circuit film 310 accommodated into the accommodating part 230 may contact the cover shield 400. In this case, the flexible circuit film 310 may be bent along a shape of the cover shield 400 contacting the flexible circuit film 310 and may be disposed in the accommodating part 230.

According to an embodiment of the present invention, since the flexible circuit film 310 is adhered to the side surface of the display panel 100, the top of the signal line is not exposed to the outside unlike the related art. Accordingly, in comparison with the related art display device, a bezel area is reduced.

The driving IC 330 may be mounted on the flexible circuit film 310. The driving IC 330 may have a COF structure, but is not limited thereto.

The PCB 350 may be accommodated into the accommodating part 230 and may be adhered to a bottom of the flexible circuit film 310. The PCB 350 may be connected to the flexible circuit film 310 to apply various signals to the display panel 100 through the flexible circuit film 310.

A supporting member 370 supporting the PCB 350 may be provided on a bottom of the PCB 350. The supporting member 370 may be adhered to a bottom of the accommodating part 230 to support the PCB 350.

The cover shield 400 may cover the driving circuit unit 300 accommodated into the accommodating part 230. An upper portion of the cover shield 400 may be folded in a direction toward the accommodating part 230, and a lower portion of the cover shield 400 may be fastened to the panel supporting frame 200. The upper portion of the cover shield 400 may press the flexible circuit film 310 in order for the flexible circuit film 310 to be disposed in the accommodating part 230. In this case, the driving IC 330 may be disposed between the flexible circuit film 310 and the cover shield 400.

An outer surface of the cover shield 400 may be disposed on the same line as an extension line extending from the outer surface of the side wall part 210, or may be disposed inward from the extension line.

The side cover film 500 may cover the display panel 100, the driving circuit unit 300, and the cover shield 400. The side cover film 500 may include a light blocking layer 510 and a conductive layer 530.

The light blocking layer 510 may have the first width W1 and may cover one side surface of the display panel 100, a whole surface of the driving circuit 300, and a whole surface of the cover shield 400.

The light blocking layer 510 prevents external light from being incident on the inside of the display device and prevents light leakage from occurring in a joint of the display device. To this end, the light blocking layer 510 may include a light shielding layer 511, a metal layer 513, and an adhesive layer 515 described above with reference to FIG. 3.

Here, the adhesive layer 515 may be adhered to a side surface of the display module. That is, the adhesive layer 515 may be adhered to the side surface of the display panel 100, the driving circuit unit 300, and the cover shield 400. Also, the adhesive layer 515 may be adhered to the conductive layer 530.

The light blocking layer 510 may be divided into a first adhesive area A1, a second adhesive area A2, and a third adhesive area A3.

The first adhesive area A1 may be adhered to one side surface of the display panel 100 exposed to the outside and the driving circuit unit 300 overlapping the one side surface of the display panel 100.

The second adhesive area A2 may be disposed in parallel with the first adhesive area A1 with the conductive layer 530 therebetween and may be adhered to a lower portion of the cover shield 400.

The third adhesive area A3 may be defined between the first adhesive area A1 and the second adhesive area A2 and may be adhered to the conductive layer 530.

The conductive layer 530 may be provided on the light blocking layer 510. The conductive layer 530 may contact the driving circuit unit 300 and the cover shield 400. The conductive layer 530 may cover the flexible circuit film 310, which is disposed on the outer surface of the side wall part 210 included in the supporting frame 200, and an upper portion of the cover shield 400.

The conductive layer 530 may cover an area of the display module from the flexible circuit film 310 adhered to the display panel 100 to the upper portion of the cover shield 400. Therefore, static electricity generated from the display panel 100 may be discharged through the conductive layer 530 in a direction from the flexible circuit film 310 to the cover shield 400. That is, the conductive layer 530 may be used as a path for electrostatic discharge (ESD).

The static electricity generated from the display panel 100 may move to the cover shield 400 along the conductive layer 530. Therefore, the static electricity generated from the display panel 100 is reduced.

The side cover film 500 may be adhered to one side surface of the panel supporting frame 200. An additional side cover film 700 may be adhered to each of side surfaces other than the one side surface of the panel supporting frame 200 to which the side cover film 500 is adhered.

The additional side cover film 700 may be formed of a film which is the same as the above-described side cover film 500. That is, the additional side cover film 700 may include a light blocking part 710 and a conductive layer 730.

The additional side cover film 700 may cover the other side surface of the display panel 100 and the outer surface of the side wall part 210 supporting the display panel 100.

The backlight unit 600 may include a rear cover 610, a plurality of light source modules 630, a reflective sheet 640, a diffusive sheet 650, and an optical sheet part 670.

The rear cover 610 may be disposed in a lower portion of the display panel 100 and may be coupled to the panel supporting frame 200. The rear cover 610 according to an embodiment may include an accommodating space which is concavely formed to have a certain height, and may accommodate the plurality of light source modules 630. For example, the rear cover 610 may include a bottom supporting part 611 and a rear cover side wall part 613.

The bottom supporting part 611 may be provided to face a portion other than an edge of the display panel 100 and may support the plurality of light source modules 630.

The rear cover side wall part 613 may be bent to surround an upper portion of the bottom supporting part 611 and have a certain height from each of side surfaces of the bottom supporting part 611, thereby allowing an accommodating space to be provided in the bottom supporting part 611. Here, the rear cover side wall part 613 may be inclined at a certain angle from each side surface of the bottom supporting part 131. The rear cover side wall part 613 may be fastened to a bottom of the panel supporting frame 200.

Therefore, the bottom supporting part 611 of the rear cover 610 and an inner inclined surface of the panel supporting frame 200 may be disposed adjacent to each other.

The plurality of light source modules 630 may be arranged at certain intervals D2 on the bottom supporting part 611 of the rear cover 610 to irradiate light onto the diffusive sheet 650. The plurality of light source modules 630 according to an embodiment may include a light source PCB 631, a dot light source package 633, and a light diffusion lens 635.

The light source PCB 631 may be provided in plurality, and the plurality of light source PCBs 631 may be arranged at certain intervals on the bottom supporting part 611 of the rear cover 610. A backlight driving signal line and a connector may be mounted on the light source PCB 631, and the light source PCB 631 may be connected to an external backlight driving circuit through the connector.

The dot light source package 633 may be provided in plurality, and the plurality of dot light source packages 633 may be arranged at certain intervals on the respective light source PCBs 631. The dot light source package 633 may be electrically connected to the backlight driving signal line and may emit light according to a backlight driving signal supplied through the backlight driving signal line. The dot light source package 633 may include a light emitting diode (LED) driving chip.

The light diffusion lens 635 may be mounted on the light source PCB 631 to cover the dot light source package 633. The light diffusion lens 635 may diffuse light emitted from the dot light source package 633 to disperse luminance in a center portion of each of the light source modules 630, thereby preventing a hot spot and enlarging a light emission area. For example, the light diffusion lens 635 may have a domed shape or a cross-sectional shape of a domed shape having a concave center.

A distance D1 between adjacent light source modules 630 may be defined as a pitch between center portions of adjacent dot light source packages 633, and may be set based on an optical gap (OG) between a top of the light source PCB 631 and the diffusive sheet 650 in order for luminance of the display panel 100 to be uniform in a whole area.

The reflective sheet 640 may be adhered to the bottom supporting part 611 of the rear cover 610 and the inner inclined surface of the panel supporting frame 200. The reflective sheet 640 may reflect light, emitted from each of the plurality of light source modules 630, toward the display panel 100.

A plurality of reflective patterns may be formed in the reflective sheet 640 and may have different sizes and intervals. Due to the reflective patterns, the light emitted from each of the plurality of light source modules 630 may travel toward the display panel 100.

The reflective sheet 640 may be formed of a polyester (PET) film, but is not limited thereto. The reflective sheet 640 may be formed in a plate shape where the plurality of reflective patterns are formed. Also, the reflective sheet 640 may be formed in a multilayer structure where the reflective sheet 640 having a film shape is adhered to a plastic plate.

The diffusive sheet 650 may be disposed in the lower portion of the display panel 100 to cover the bottom supporting part 611 of the rear cover 610 and may diffuse the light emitted from each of the plurality of light source modules 630. The related art diffusive plate is replaced by the diffuse sheet 650, and the diffusive sheet 650 may include at least one of a haze, a light diffusion pattern, and a light diffusion member. To this end, the diffusive sheet 650 may be formed relatively thinner than the related art diffusive plate.

The optical sheet part 670 may be disposed on each of the light source modules 630 and may enhance a luminance characteristic of the light emitted from each of the light source modules 630 to irradiate the luminance-enhanced light onto the display panel 100.

The optical sheet part 670 may include a lower diffusive sheet, a prism sheet, and an upper diffusive sheet, but is not limited thereto. In other embodiments, the optical sheet part 670 may be configured by a stacked combination of two or more sheets selected from among a diffusive sheet, a prism sheet, a dual brightness enhancement film, and a lenticular sheet.

The optical sheet part 670 may collect and diffuse light to irradiate the light toward the display panel 400, for increasing luminance of the display panel 100.

In the present specification, an LCD device has been described above as an example of the present invention, but is not limited thereto. The present invention may be applied to various display devices (for example, organic light emitting display devices) as well as the LCD device.

As described above, according to the embodiments of the present invention, since the flexible circuit film is adhered to the side surface of each of the lower substrate and the upper substrate, the top of the signal line is not exposed to the outside unlike the related art. Accordingly, in comparison with the related art display device, the bezel area is reduced.

Moreover, according to the embodiments of the present invention, since the side cover film including the light blocking layer covers the side surface of the display module, external light is prevented from being incident on the inside of the display module, thereby preventing light leakage from occurring in the joint of the display module.

Moreover, according to the embodiments of the present invention, since the conductive layer included in the side cover film contacts the flexible circuit film and the upper area of the cover shield, static electricity occurring in the display panel is effectively discharged.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A side cover film for a display device, the side cover film being adhered to a side surface of a display module of the display device, and comprising:
    a light blocking layer having a first width; and
    a conductive layer on the light blocking layer, the conductive layer having a second width narrower than the first width.

2. The side cover film of claim 1, wherein the light blocking layer comprises:
    a light shielding layer;
    a metal layer provided on the light shielding layer; and
    an adhesive layer provided on the metal layer, and
    wherein the conductive layer is provided on the adhesive layer.

3. A display device comprising:
    a display panel including at least one signal line;
    a panel supporting frame supporting the display panel;
    a driving circuit unit connected to the at least one signal line at a side surface of the display panel, and disposed on one side surface of the panel supporting frame;
    a cover shield covering the driving circuit unit; and
    a side cover film covering the side surface of the display panel,
    wherein the side cover film comprises:
    a light blocking layer having a first width, and covering one side surface of the display panel, a whole surface of the driving circuit unit, and a whole surface of the cover shield; and
    a conductive layer on the light blocking layer, the conductive layer having a second width narrower than the first width and contacting the driving circuit unit and the cover shield.

4. The display device of claim 3, wherein the light blocking layer comprises:
    a first adhesive area adhered to one side surface of the display panel exposed to the outside and the driving circuit unit overlapping the one side surface of the display panel;
    a second adhesive area contacting a bottom of the cover shield; and
    a third adhesive area defined between the first adhesive area and the second adhesive area, the third adhesive area contacting the conductive layer.

5. The display device of claim 3, wherein the light blocking layer comprises:
    a light shielding layer;
    a metal layer provided on the light shielding layer; and
    an adhesive layer provided on the metal layer, the adhesive layer contacting a side surface of the display panel, the driving circuit unit, the conductive layer, and a bottom of the cover shield.

6. The display device of claim 3, wherein the panel supporting frame comprises:
    a side wall part supporting the display panel; and
    an accommodating part provided on an outer surface of the side wall part, and
    wherein an upper portion of the driving circuit unit is connected to the at least one signal line, and a lower portion of the driving circuit unit is accommodated into the accommodating part.

7. The display device of claim 6, wherein the driving circuit unit comprises:
    a flexible circuit film connected to the at least one signal line;
    a driving integrated circuit (IC) mounted on the flexible circuit film; and
    a printed circuit board (PCB) accommodated into the accommodating part and connected to the flexible circuit film, and
    wherein the cover shield contacts the driving IC.

8. The display device of claim 7, wherein the conductive layer contacts the flexible circuit film and an upper area of the cover shield.

9. The display device of claim 7, wherein an outer surface of the cover shield is disposed on the same line as an extension line extending from the outer surface of the side wall part, or is disposed inward from the extension line.

10. The display device of claim 3, further comprising:
   an additional side cover film covering side surfaces other than the one side surface of the panel supporting frame.

11. The display device of claim 10, wherein the additional side cover film comprises:
   a light blocking layer covering the side surface of the display panel; and
   a conductive layer provided on the light blocking layer.

* * * * *